United States Patent [19]

Dennison et al.

[11] Patent Number: 5,061,650
[45] Date of Patent: Oct. 29, 1991

[54] METHOD FOR FORMATION OF A STACKED CAPACITOR

[75] Inventors: Charles H. Dennison; Hiang Chan; Yauh-Ching Liu; Pierre Fazan; Howard E. Rhodes, all of Boise, Id.

[73] Assignee: Micron Technology, Inc., Boise, Id.

[21] Appl. No.: 643,835

[22] Filed: Jan. 17, 1991

[51] Int. Cl.$^5$ .............. H01L 21; H01L 283
[52] U.S. Cl. .................. 437/47; 437/52; 437/60; 357/23.6
[58] Field of Search ............ 437/52, 47, 60; 357/23.6, 23.6 G

[56] References Cited

PUBLICATIONS

T. Ema et al., "3-Dimensional Stacked Capacitor Cell For 16M and 64M DRAMS", IEDM 1988, pp. 592–595.
S. Inoue et al., "A Spread Stacked Capacitor (SSC) Cell For 64MBIT DRAMs", IEDM 1989, pp. 31–34.
H. Watanabe et al., "A New Stacked Capacitor Structure Using Hemispherical-Grain (HSG) Poly-Silicon Electrodes", Extended Abstracts of the 22nd (1990 International Conference on Solid State Device and Materials, 1990, pp. 873–887.
Hayashide et al., "Fabrication of Storage Capacitance--Enhanced Capacitors with a Rouge Electrode", Extended Abstracts of the 22nd (1990 International) Conference on Solid State Devices and Materials, 1990, pp. 869–872.
Fazan et al., "Thin Nitride Films on Textured Polysilicon to Increase Multimegabit DRAM Cell Charge Capacity", IEEE Electron Device Letters, vol. 11, No. 7, Jul. 1990, pp. 279–281.
T. Mine et al., "Capacitance-Enhanced Staked-Capacitor with Engraved Storage Electrode for Deep Submicron DRAMS", Extended Abstracts of the 21st Conference on Solid State Devices and Materials, 1989, pp. 137–140.
"Stacked Capacitor DRAM Cell with Vertical Fins", IBM Technical Disclosure Bulletin, vol. 33, No. 2, Jul. 1990, pp. 245–247.
Kaga et al., "Crown-Shaped Stacked Capacitor Cell for 1.5-V Operation 65-Mb DRAM's", IEEE Transactions on Electron Devices, vol. 38, No. 2, Feb. 1991, pp. 255–260.

Primary Examiner—Olik Chaudhuri
Assistant Examiner—Ourmazd Ojan
Attorney, Agent, or Firm—Wells, St. John & Roberts

[57] ABSTRACT

A method is disclosed for forming a capacitor on a semiconductor wafer. A first electrically conductive layer is applied atop the wafer and engages exposed active areas. A first dielectric layer is next applied. The first dielectric and conductive layers are then patterned to define an outline for the lower capacitor plate. A second dielectric layer, having an etch rate which is slower than the first, is then applied and planarized or otherwise etched down to the first dielectric layer. The first dielectric layer is then etched down to the first conductive layer to produce upwardly projecting walls of second dielectric material surrounding the lower capacitor plate outline. A second electrically conductive layer is then applied. It is then anisotropically etched to provide a first electrically conductive wall extending upwardly from the first conductive layer. A third dielectric layer is then applied. The third dielectric layer is then anisotropicallly etched to provide a first dielectric wall extending upwardly from the first conductive layer adjacent the first conductive wall. A third electrically conductive layer is next applied over the first conductive and dielectric walls. It is then anisotropically etched to provide a second electrically conductive wall extending upwardly from the first conductive layer adjacent the first dielectric wall. The first dielectric wall is then etched from the wafer. A capacitor dielectric layer is then applied, followed by a fourth electrically conductive layer to form an upper capacitor plate.

22 Claims, 7 Drawing Sheets

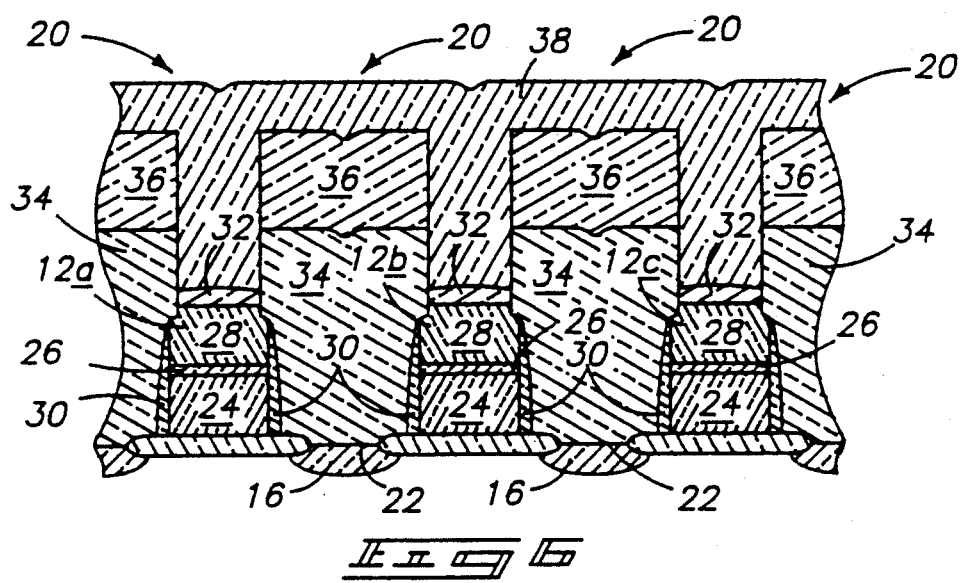
_FIG 6_
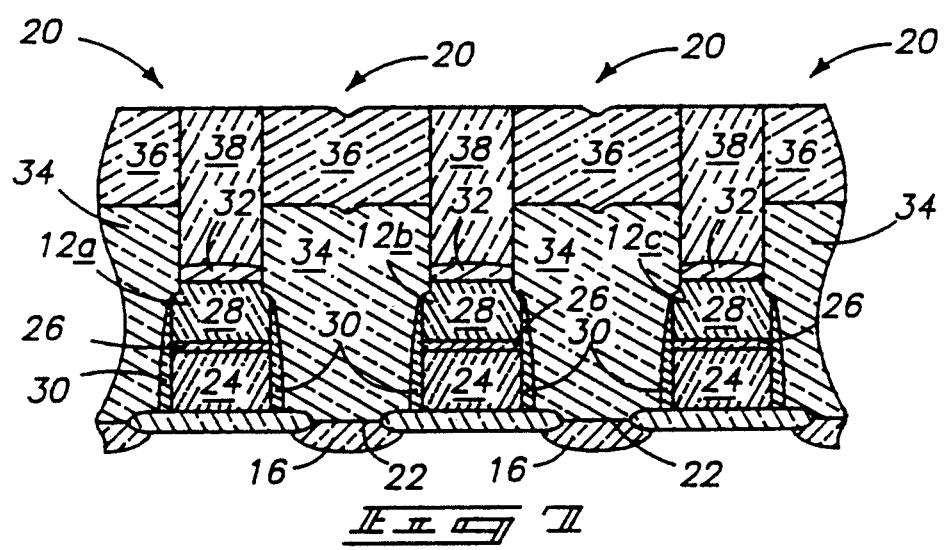
_FIG 7_
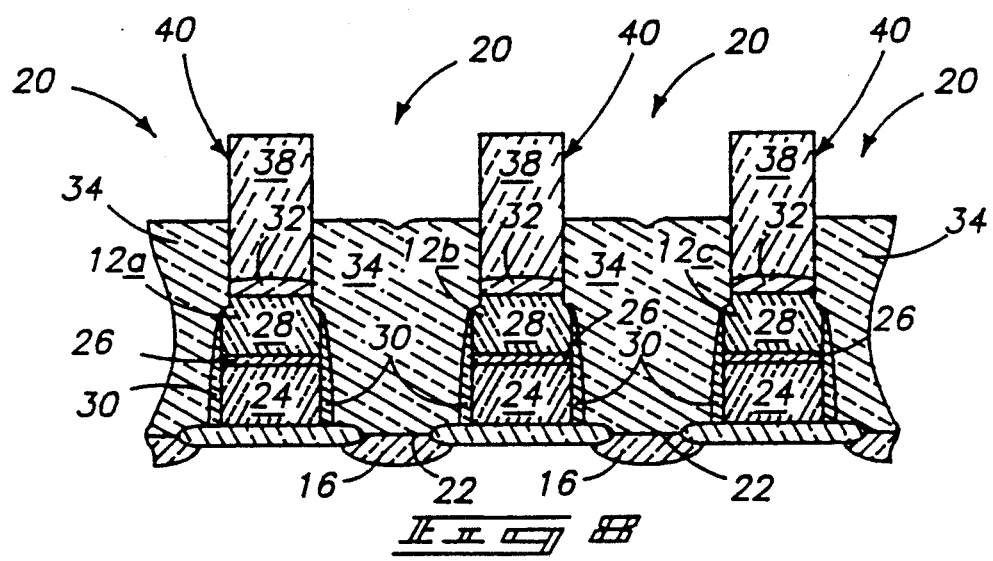
_FIG 8_

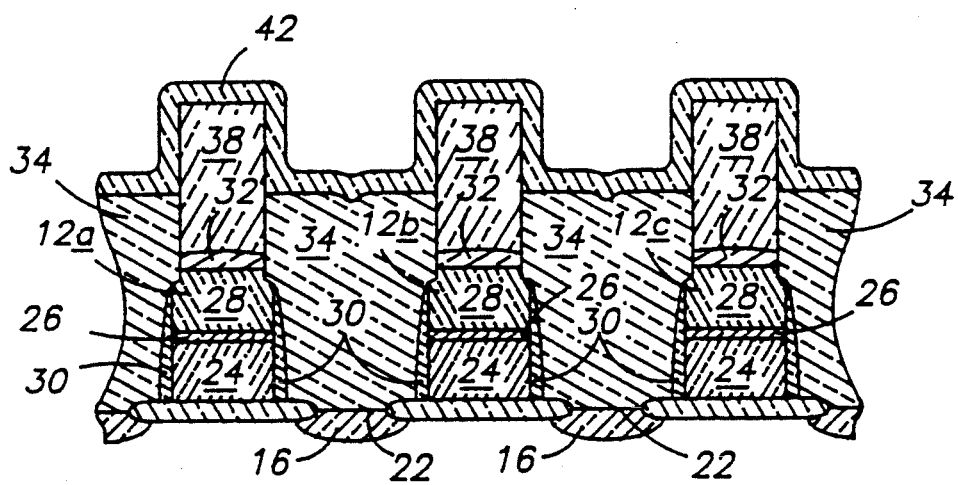
F I G 9
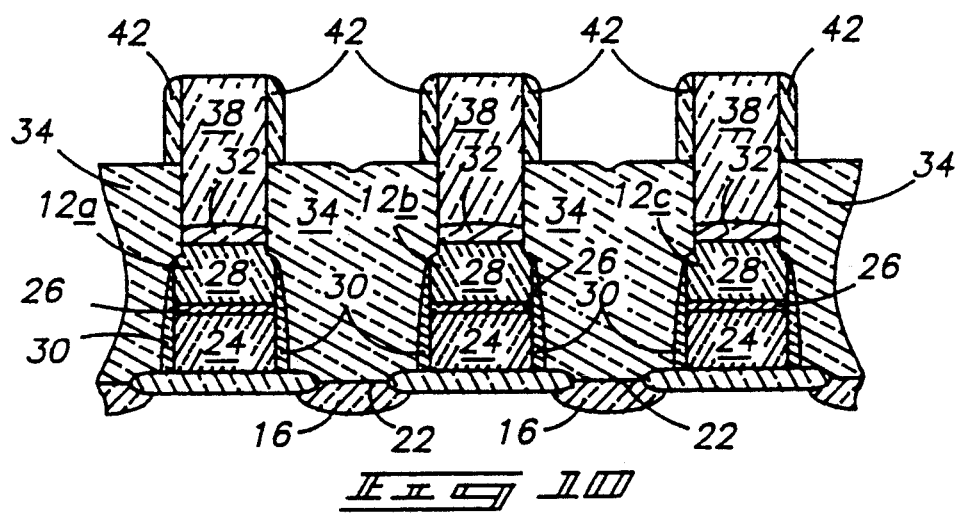
F I G 10
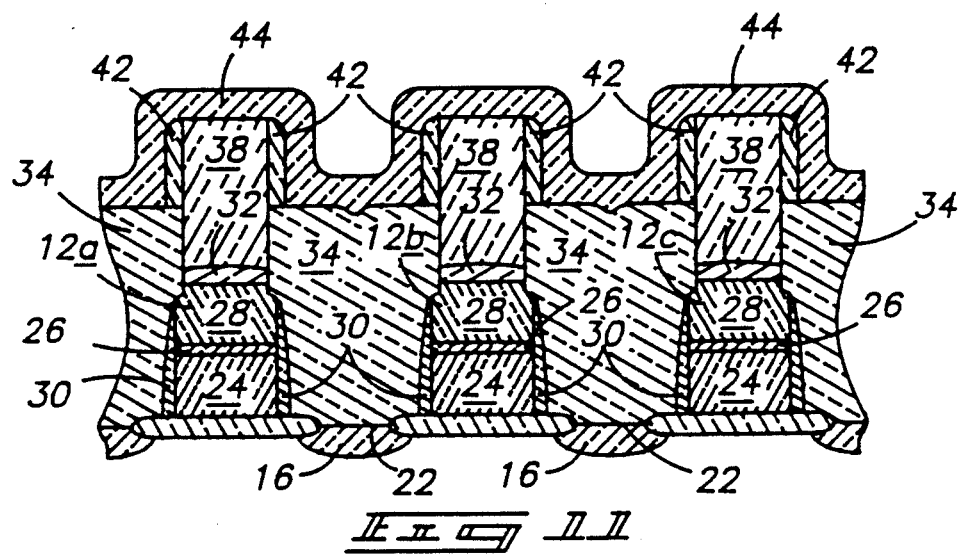
F I G 11

METHOD FOR FORMATION OF A STACKED CAPACITOR

TECHNICAL FIELD

This invention relates generally to three dimensional stacked capacitors and fabrication thereof.

BACKGROUND OF THE INVENTION

As DRAMs increase in memory cell density, there is a continuous challenge to maintain a sufficiently high storage capacitance despite decreasing cell area. A principle way of increasing cell density is through cell structure techniques. Such techniques include three dimensional cell capacitors such as trenched or stacked capacitors.

With a conventional stacked capacitor, the capacitor is formed immediately above and electrically connected to the active device area of the associated MOS transistor of the memory cell. Typically, only the upper surface of the lower storage polysilicon node of the capacitor is utilized for capacitance. However, some attempts have been made to provide constructions to increase capacitance, whereby the backside of one capacitor terminal is used to store charge. Such is shown by way of example by T. Ema et al., "3-Dimensional Stacked Capacitor Cell For 16M And 64M DRAMS" IEDM Tech. Digest, pp. 592-595, 1988 and S. Inoue et al., "A Spread Stacked Capacitor (SSC) Cell For 64M BIT DRAMS", IEDM Tech Digest, pp. 31-34, 1989.

The article by Ema et al. discloses a construction for 16 and 64 megabit DRAMs. FIGS. 1 and 11 from this article illustrate a vertically rising capacitor construction having a plurality of horizontal fins, both sides of which are utilized for stored capacitance. The article to Inoue et al. utilizes spread of horizontal area for a three dimensional stacked capacitor construction. Both such process significantly add tedious processing steps over conventional techniques for creation of three dimensional stack cell capacitors, and require that tight tolerances be adhered to in contact alignment. Additionally, the processing disclosed by Inoue et al. creates difficulties in obtaining adequate coverage of applied material (such as the capacitor dielectric film) within the area beneath the horizontal fins.

It would be desirable to improve upon these and other processes in providing three dimensional stacked capacitors which maximize capacitance.

BRIEF DESCRIPTION OF THE DRAWINGS

The preferred embodiment of the invention is illustrated in the accompanying drawings, in which:

FIG. 1 is a top plan depiction of a portion of a semiconductor chip produced by a process in accordance with the invention.

FIGS. 2-18 are each cross-sectional views of a portion of a semiconductor wafer processed in accordance with the invention at one particular step in the inventive process which is taken through either of cross-sectional lines A—A in FIG. 1.

More specifically, FIG. 2 is a diagrammatic section as described above at one processing step of a processing method in accordance with the invention.

FIG. 3 is a diagrammatic section of a substrate wafer at a processing step subsequent to that illustrated by FIG. 2 using a processing method in accordance with the invention.

FIG. 4 is a diagrammatic section of a substrate wafer at a processing step subsequent to that illustrated by FIG. 3 using a processing method in accordance with the invention.

FIG. 5 is a diagrammatic section of a substrate wafer at a processing step subsequent to that illustrated by FIG. 4 using a processing method in accordance with the invention.

FIG. 6 is a diagrammatic section of a substrate wafer at a processing step subsequent to that illustrated by FIG. 5 using a processing method in accordance with the invention.

FIG. 7 is a diagrammatic section of a substrate wafer at a processing step subsequent to that illustrated by FIG. 6 using a processing method in accordance with the invention.

FIG. 8 is a diagrammatic section of a substrate wafer at a processing step subsequent to that illustrated by FIG. 7 using a processing method in accordance with the invention.

FIG. 9 is a diagrammatic section of a substrate wafer at a processing step subsequent to that illustrated by FIG. 8 using a processing method in accordance with the invention.

FIG. 10 is a diagrammatic section of a substrate wafer at a processing step subsequent to that illustrated by FIG. 9 using a processing method in accordance with the invention.

FIG. 11 is a diagrammatic section of a substrate wafer at a processing step subsequent to that illustrated by FIG. 10 using a processing method in accordance with the invention.

FIG. 12 is a diagrammatic section of a substrate wafer at a processing step subsequent to that illustrated by FIG. 11 using a processing method in accordance with the invention.

FIG. 13 is a diagrammatic section of a substrate wafer at a processing step subsequent to that illustrated by FIG. 12 using a processing method in accordance with the invention.

FIG. 14 is a diagrammatic section of a substrate wafer at a processing step subsequent to that illustrated by FIG. 13 using a processing method in accordance with the invention.

FIG. 15 is a diagrammatic section of a substrate wafer at a processing step subsequent to that illustrated by FIG. 14 using a processing method in accordance with the invention.

FIG. 16 is a top view of an isolated portion of the semiconductor wafer at the processing step illustrated by FIG. 15.

FIG. 17 is a diagrammatic section of a substrate wafer at a processing step subsequent to that illustrated by FIG. 15 using a processing method in accordance with the invention.

FIG. 18 is a diagrammatic section of a substrate wafer at a processing step subsequent to that illustrated by FIG. 17 using a processing method in accordance with the invention.

DETAILED DESCRIPTION OF THE PREFERRED EMBODIMENTS

Figure 2:
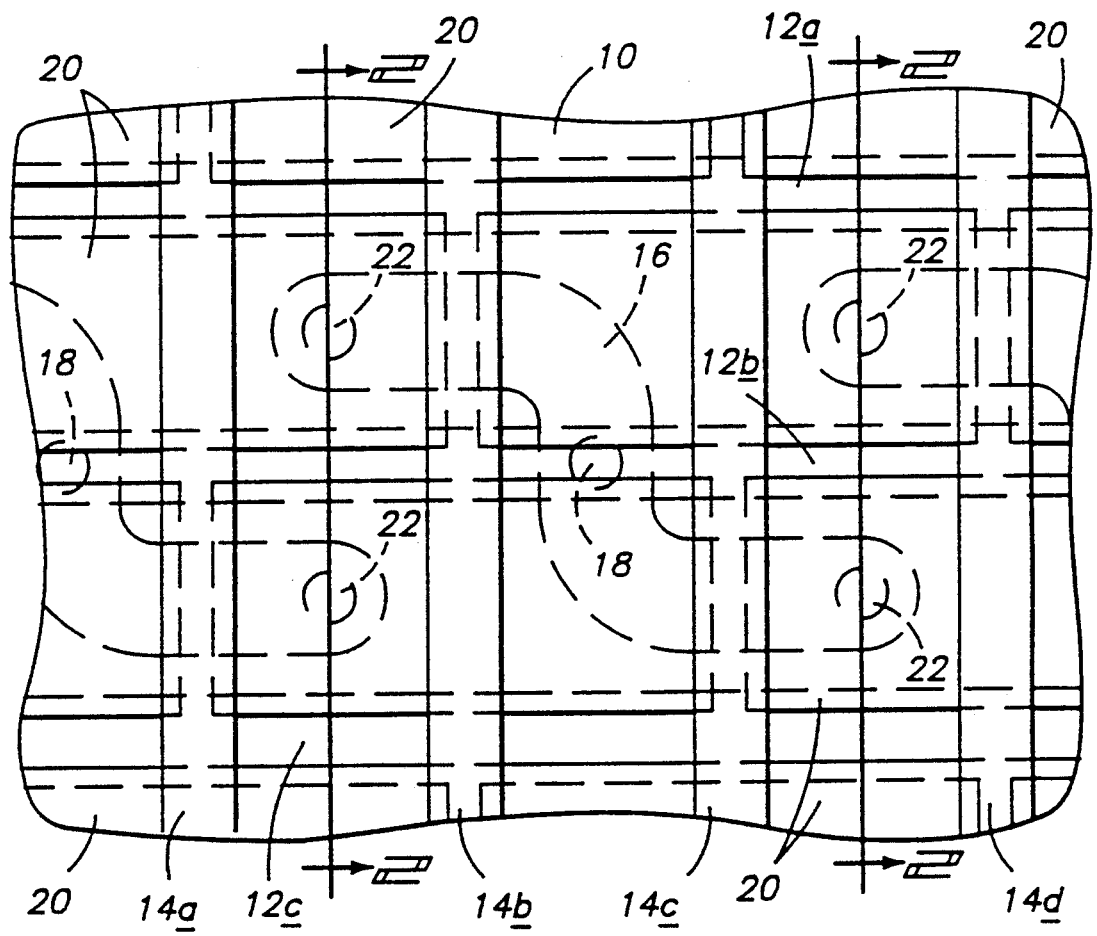
Figure 2:
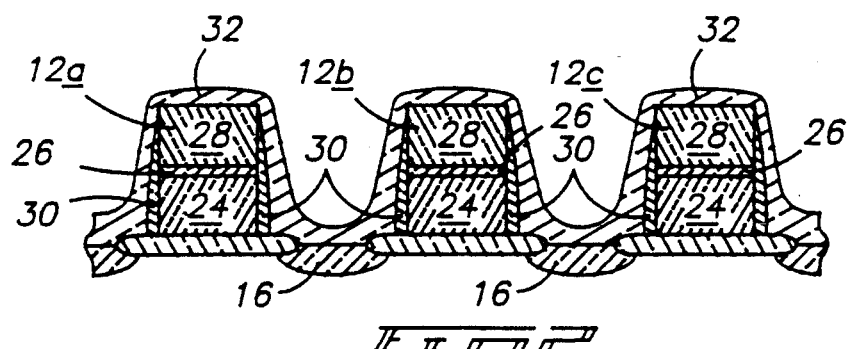

The following disclosure of the invention is submitted in furtherance with the constitutional purpose of the Patent Laws "to promote the progress of science and useful arts" (Article 1, Section 8).

In accordance with the invention, a method of forming a capacitor on a semiconductor wafer comprises the following steps:

selectively processing the wafer to define upwardly exposed active areas for electrical connection with a lower capacitor plate;

applying a first electrically conductive layer atop the wafer, the first electrically conductive layer covering and engaging the exposed active areas;

applying a first dielectric layer of a first dielectric material atop the wafer over the first conductive layer, the first dielectric material having a first etch rate;

selectively patterning the first dielectric layer and first conductive layer to define an outline for a lower capacitor plate;

applying a second dielectric layer of a second dielectric material atop the wafer over the patterned first dielectric layer, the second dielectric material having a second etch rate which is slower than the first etch rate;

etching the second dielectric layer;

etching the first dielectric layer down to the first conductive layer to produce upwardly projecting walls of second dielectric material surrounding the lower capacitor plate outline; applying a second electrically conductive layer atop the wafer;

anisotropically etching the second conductive layer to provide a first electrically conductive wall extending upwardly from the first conductive layer;

applying a third dielectric layer atop the wafer, the third dielectric layer comprising a dielectric material having an etch rate which is faster than the second etch rate;

anisotropically etching the third dielectric layer to provide a first dielectric wall extending upwardly from the first conductive layer adjacent the first conductive wall;

applying a third electrically conductive layer atop the wafer over the first conductive and dielectric walls;

anisotropically etching the third conductive layer to provide a second electrically conductive wall extending upwardly from the first conductive layer adjacent the first dielectric wall, the first dielectric wall being sandwiched between the first and second conductive walls;

etching the first dielectric wall from the wafer;

applying a capacitor dielectric layer atop the wafer over the first and second conductive walls and exposed first conductive layer; and applying a fourth electrically conductive layer atop the wafer over the capacitor dielectric layer to form an upper capacitor plate.

More specifically and with reference to the figures, FIG. 1 illustrates a top plan view of a portion of a DRAM array. Diagrammatically illustrated is a wafer fragment 10 comprised of a series of bit or digit lines 12a, 12b, 12c and word lines 14a, 14b, 14c, and 14d. The rough Z-like shaped encircled area 16 denotes the common active drain area between a pair of transistors, which connects to bit line 12b by a buried contact 18. Wafer fragment 10 also comprises capacitors illustrated by bottom capacitor plate outlines 20, which electrically connect to active area 16 via buried contacts 22.

A description for producing such a construction proceeds first with reference to FIG. 2. Electrically conductive interconnecting bit or digit lines 12a, 12b and 12c are formed after active area and word line formation. Lines 12a, 12b and 12c are illustrated as having a conventional sandwich construction, each having a conductively doped polysilicon section 24 and an overlying region 26 comprised of a higher conducting material than doped polysilicon, such as $WSi_x$. The top of the more conductive section 26 is covered by an electrically isolating layer 28 of oxide. The sides of digit lines 12a, 12b and 12c have insulating oxide spacers 30 formed thereabout. Construction of digit lines 12a, 12b and 12c can be of any conventional technique, and does not constitute part of the invention.

Figure 3:
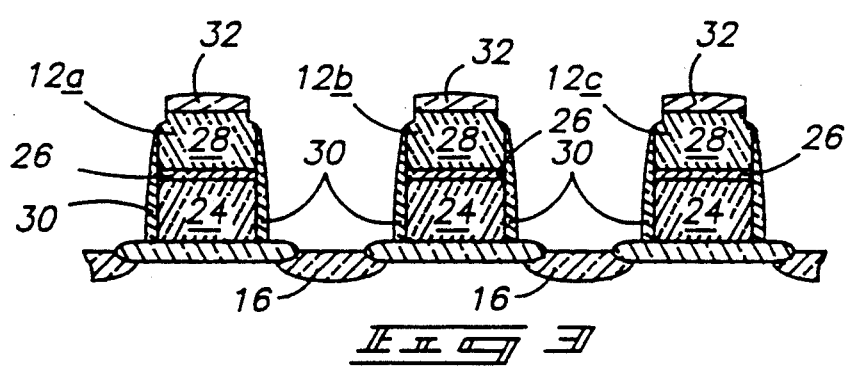

An insulating dielectric layer 32 is applied atop wafer 10 for insulating isolation of exposed active areas. Layer 32 would typically be approximately 500 to 1500 Angstroms thick. Using photolithography or other techniques, contact openings 22 are patterned and etched to provide access to active area 16, as indicated in FIG. 3. In this manner, the wafer has been selectively processed to define upwardly exposed active areas through contact openings 22 for electrical connection with a lower capacitor plate as will become apparent from the continuing discussion.

Figure 4:
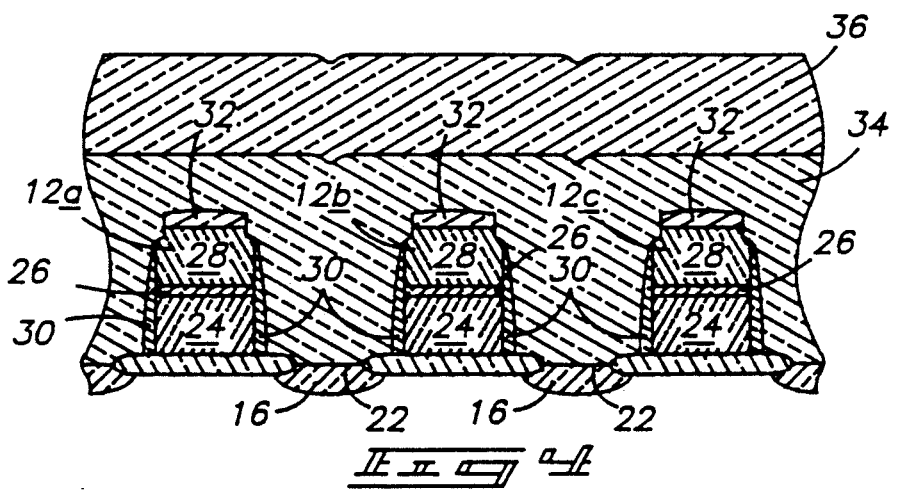
Figure 5:
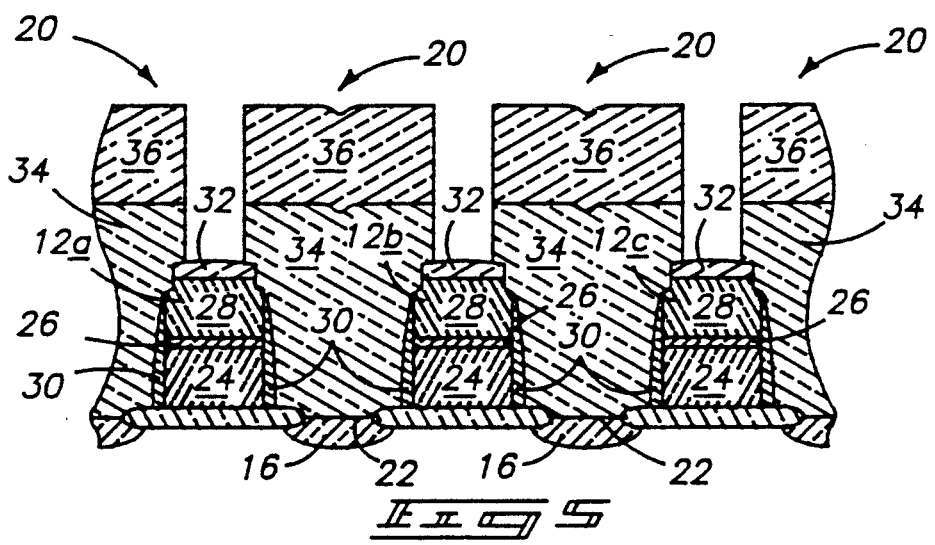

Referring to FIG. 4, a first electrically conductive layer 34 is applied atop the wafer and covers and engages exposed active area 16 through contact openings 22. Layer 34 preferably comprises conductively doped polysilicon applied to a thickness of from 1000 Angstroms to 4000 Angstroms. Subsequently, a first dielectric layer 36 of a first dielectric material is applied atop the wafer over first conductive layer 34. First dielectric material should have some known, selected etch rate for reasons which will become apparent from the continuing discussion. An example suitable material for the first dielectric layer is $Si_3N_4$. Such can be applied by known low pressure chemical vapor deposition techniques (LPCVD), and would preferably be applied to a thickness of from 2000 to 4000 Angstroms. Layers 34 and 36 would be collectively selectively patterned to define outlines 20 for the lower capacitor plates, as is illustrated in cross section in FIG. 5.

Referring to FIG. 6, a second dielectric layer 38 of a second dielectric material is applied over the wafer over the patterned first dielectric layer 36. The second dielectric material should have a second etch rate which is slower than the first etch rate of the first dielectric material. One example of a suitable dielectric material would be tetraethyl orthosilicate (TEOS), a form of silicon dioxide, which can be deposited by known techniques at 650° C. to 750° C. in an LPCVD process by decomposing tetrathoxysilane, $Si(OC_2H_5)_4$. Layer 38 is preferably applied to a thickness of from 2000 Angstroms to 5000 Angstroms. The applied TEOS should be densified, such as by heating at 900° C. for approximately five minutes, to provide a TEOS layer having an etch rate which is significantly slower than the etch rate of the first dielectric layer.

Referring to FIG. 7, layer 38 is then planarized or otherwise dry etched, by techniques well known in the art, to a point of upwardly exposing first patterned dielectric layer 36.

Referring to FIG. 8, first dielectric layer 36 is next isotropically etched by any of several well known techniques down to first conductive layer 34. A preferred wet etching method employs phosphoric acid at 150° C.

for approximately twenty to thirty minutes where layer 36 is comprised of $Si_3N_4$. This produces upwardly projecting walls 40, which in the preferred embodiment are in the form of rings of second dielectric material which surround the respective lower capacitor plate outlines 20. The reason for different etch rates of first and second layers 36, 38 respectively, will now be apparent. At this step in the process, the intent is to generate the projecting walls 40 elevationally above conductive layer 34. To facilitate this, materials 36 and 38 need to have different etch rates to enable layer 38 to remain substantially intact while etching of the material of layer 36 occurs. Layer 36 is applied in the first place to provide a raised material which can be etched to provide the volume for formation of walls 40 (see FIG. 5).

Referring to FIG. 9, a second electrically conductive layer 42 is applied atop the wafer over the upwardly projecting walls of material 38 and first conductive layer 34. Second electrically conductive layer 42 is preferably comprised of conductively doped polysilicon, applied to a thickness of from 500 Angstroms to 2000 Angstroms. Second conductive layer 42 is then anisotropically etched by any well known technique, such as by dry plasma etching, to produce the construction illustrated in FIG. 10. After the anisotropic etching, the portion of layer 42 which remains will provide a first electrically conductive ring which extends upwardly from first electrically conductive layer 34 immediately inward of the periphery of lower capacitor plate outlines 20.

Figure 12:
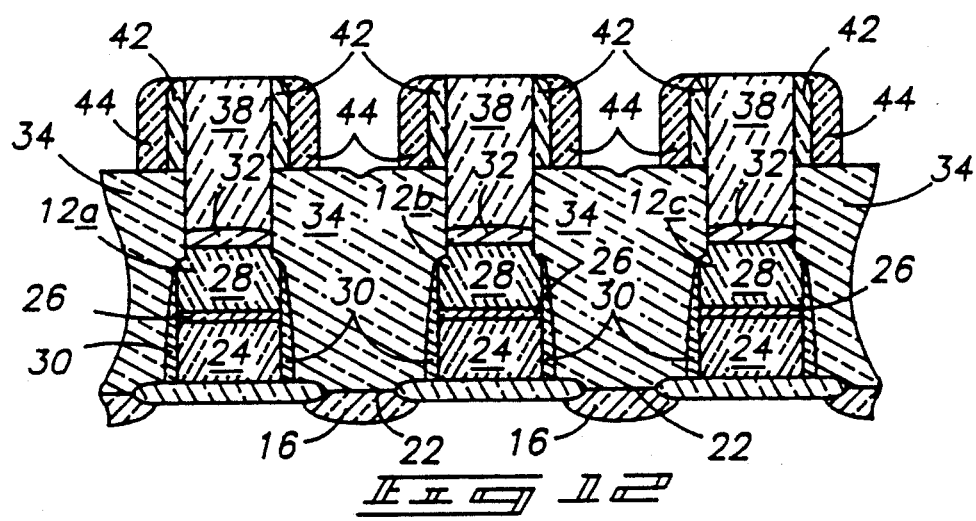

Referring to FIG. 11, a third dielectric layer 44 is applied atop the wafer. Dielectric layer 44 comprises a dielectric material having an etch rate which is faster than the second etch rate of the material of layer 38, and is preferably the same $Si_3N_4$ material of first dielectric layer 36. Layer 44 is preferably applied to a thickness of from 500 to 2000 Angstroms. Third dielectric layer 44 is then anisotropically etched by any accepted technique to provide the construction illustrated by FIG. 12. The remaining portion of layer 44 will provide a first dielectric ring which extends upwardly from first conductive layer 34 inwardly adjacent the first conductive ring defined by remaining material 42 of the second conductive layer.

Figure 13:
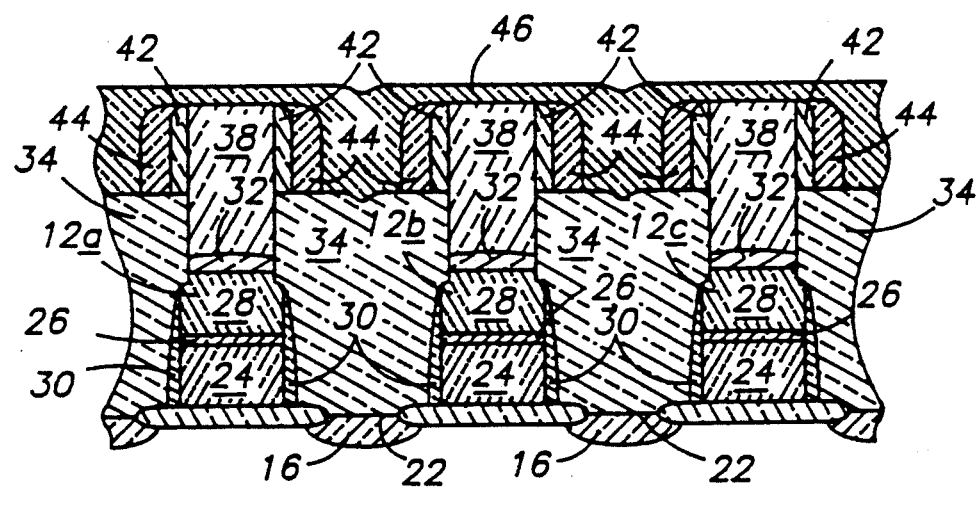
Figure 14:
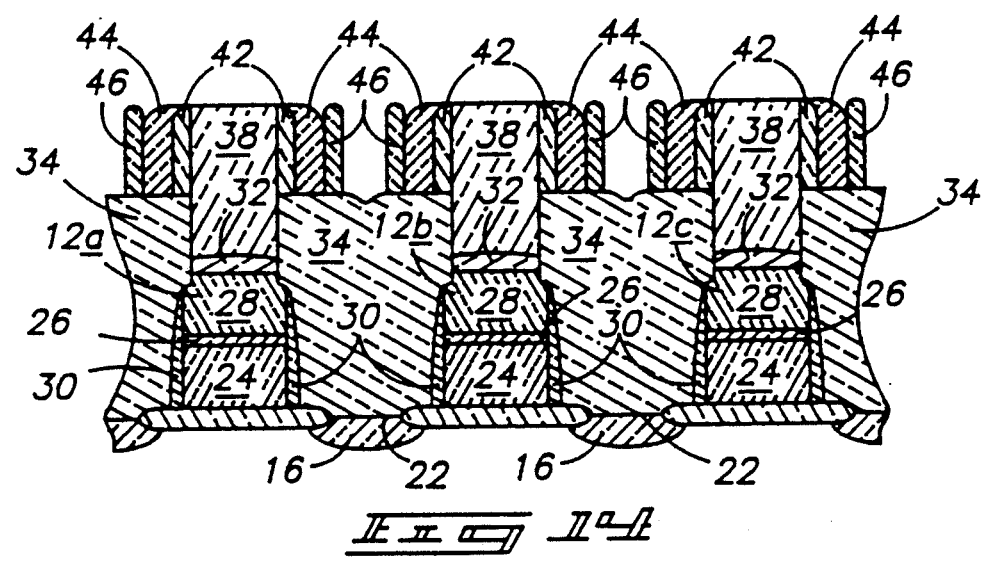

Referring to FIG. 13, a third electrically conductive layer 46 is applied atop the wafer over the first conductive ring defined by material 42 and the first dielectric ring defined by material 44. Third conductive layer 46 preferably comprises conductively doped polysilicon applied to a thickness of from 500 to 2000 Angstroms. Layer 46 is then anisotropically etched to provide the construction of FIG. 14. The remaining portion of layer 46 after the anisotropic etch will provide a second electrically conductive ring extending upwardly from first conductive layer 34 inwardly adjacent the first dielectric ring defined by the remaining portions of dielectric layer 44. The first dielectric ring of remaining material 44, as is apparent from FIG. 14, is sandwiched between the first and second electrically conductive rings defined by remaining material of layers 42, 46 respectively.

Figure 15:
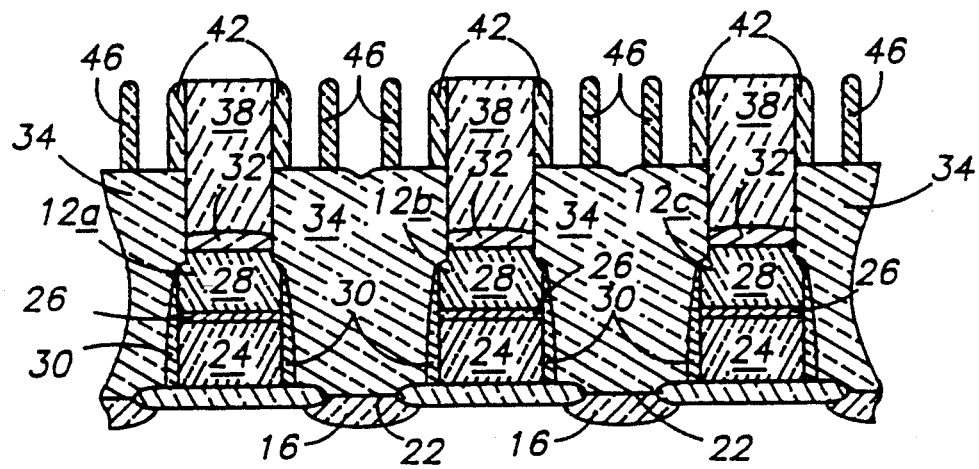
Figure 16:
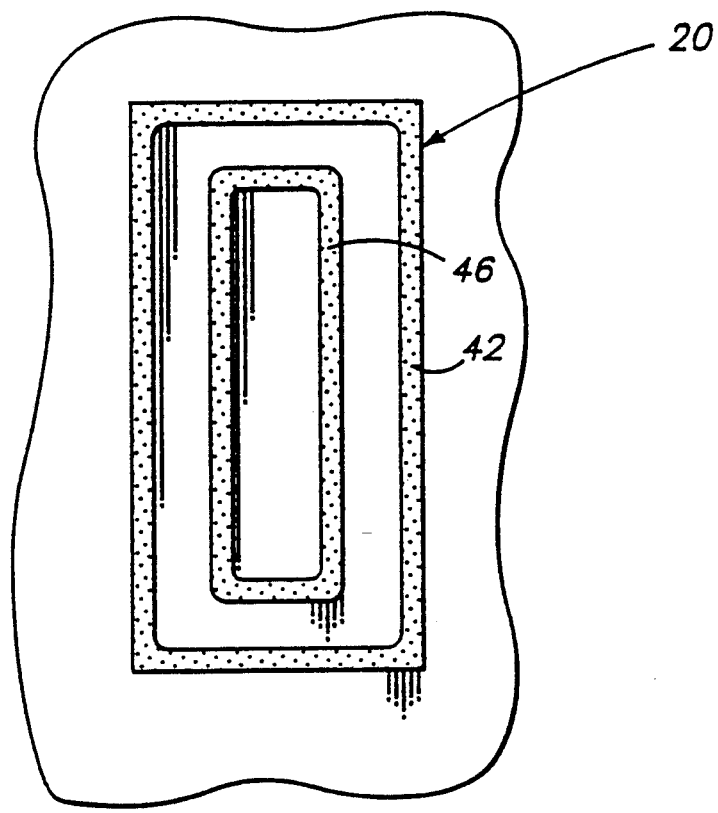
Figure 17:
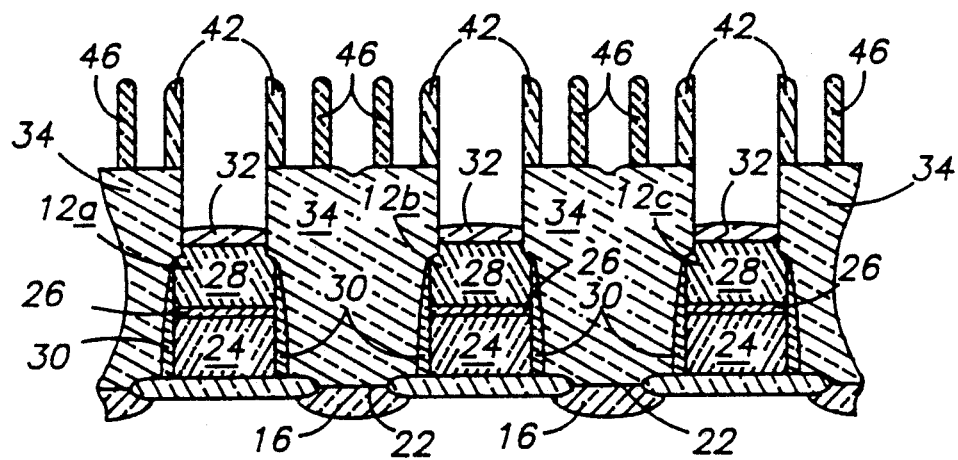

Referring to FIG. 15, the first dielectric ring defined by the remainder of dielectric layer 44 is then isotropically etched from the wafer to produce the illustrated construction. FIG. 16 is an isolated top view of one lower capacitor plate outline 20 illustrating the removal of material 44, and the defined first and second conductive rings defined by material 42 and 46. Second dielectric layer 38 can then be isotropically etched, such as wet etched, from the wafer to produce a construction such as illustrated by FIG. 17. The exposed portions of layer 34 and rings 42 and 46 could then be texturized by techniques well known in the art for further area maximization of what will be the lower plates of the capacitors which are being formed.

Figure 18:
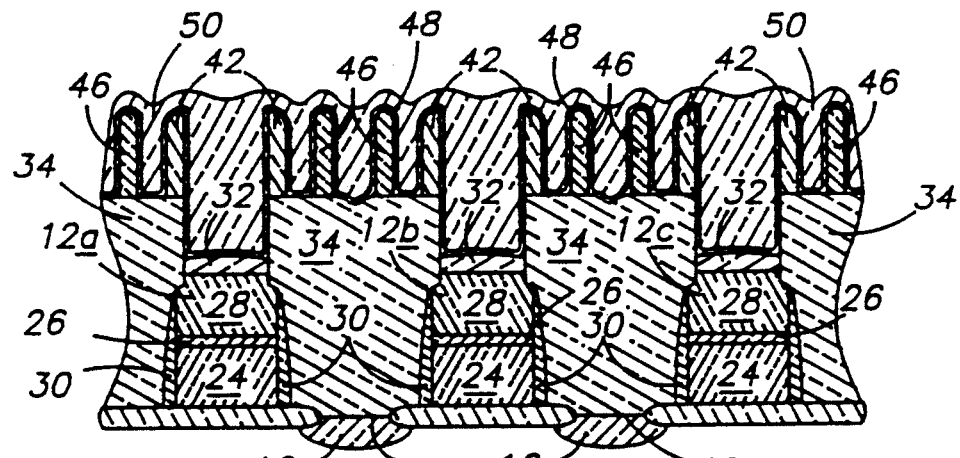

Referring to FIG. 18, a capacitor dielectric layer 48 is then applied atop the wafer over the first and second conductive rings 42, 46 respectively, and exposed first conductive layer 34. Layer 48 would preferably be approximately 100 Angstroms thick, and comprise $Si_3N_4$. Then, a fourth electrically conductive layer 50 would be applied atop the wafer over capacitor dielectric layer 48 to form an upper capacitor plate. Layer 50 would preferably be doped polysilicon applied to a thickness of 2000 to 3000 Angstroms.

Figure 19:
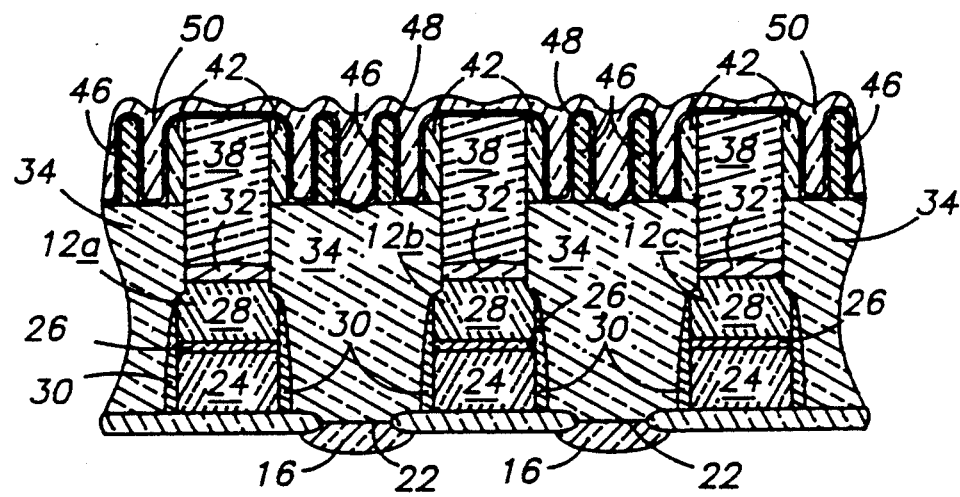
FIG. 19 is a diagrammatic section of a substrate wafer taken through line A—A of FIG. 1, but illustrating an alternate process step subsequent to that illustrated by FIG. 17 using a processing method in accordance with the invention.

FIG. 19 illustrates an alternate embodiment whereby second dielectric layer 38 is not removed prior to application of the capacitor dielectric layer 48 and upper poly plate layer 50. Removal of layer 38 is preferred to further maximize the exposed area for capacitance by utilizing the outer sides of rings 42.

In compliance with the statute, the invention has been described in language more or less specific as to structural and methodical features. It is to be understood, however, that the invention is not limited to the specific features shown and described, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A method of forming a capacitor on a semiconductor wafer comprising the following steps:

selectively processing the wafer to define upwardly exposed active areas for electrical connection with a lower capacitor plate;

applying a first electrically conductive layer atop the wafer, the first electrically conductive layer covering and engaging the exposed active areas;

applying a first dielectric layer of a first dielectric material atop the wafer over the first conductive layer, the first dielectric material having a first etch rate;

selectively patterning the first dielectric layer and first conductive layer to define an outline for a lower capacitor plate;

applying a second dielectric layer of a second dielectric material atop the wafer over the patterned first dielectric layer, the second dielectric material having a second etch rate which is slower than the first etch rate;

etching the second dielectric layer;

etching the first dielectric layer down to the first conductive layer to produce upwardly projecting walls of second dielectric material surrounding the lower capacitor plate outline;

applying a second electrically conductive layer atop the wafer over the upwardly projecting walls and first conductive layer;

anisotropically etching the second conductive layer to provide a first electrically conductive ring extending upwardly from the first conductive layer;

applying a third dielectric layer atop the wafer, the third dielectric layer comprising a dielectric material having an etch rate which is faster than the second etch rate;

anisotropically etching the third dielectric layer to provide a first dielectric ring extending upwardly from the first conductive layer inwardly adjacent the first conductive ring;

applying a third electrically conductive layer atop the wafer over the first conductive and dielectric rings;

anisotropically etching the third conductive layer to provide a second electrically conductive ring extending upwardly from the first conductive layer inwardly adjacent the first dielectric ring, the first dielectric ring being sandwiched between the first and second electrically conductive rings;

etching the first dielectric ring from the wafer;

applying a capacitor dielectric layer atop the wafer over the first and second conductive rings and exposed first conductive layer; and applying a fourth electrically conductive layer atop the wafer over the capacitor dielectric layer to form an upper capacitor plate.

2. The method of forming a capacitor of claim 1 further comprising etching the walls of second dielectric material from the wafer prior to applying the capacitor dielectric layer.

3. The method of forming a capacitor of claim 1 wherein the first dielectric material consists essentially of $Si_3N_4$.

4. The method of forming a capacitor of claim 1 wherein the second dielectric material consists essentially of densified tetraethyl orthosilicate.

5. The method of forming a capacitor of claim 1 wherein the third dielectric layer consists essentially of $Si_3N_4$.

6. The method of forming a capacitor of claim 1 wherein the first dielectric material and the third dielectric layer consist essentially of $Si_3N_4$.

7. The method of forming a capacitor of claim 1 wherein the first dielectric material and the third dielectric layer consist essentially of $Si_3N_4$, and the second dielectric material consists essentially of densified tetraethyl orthosilicate.

8. The method of forming a capacitor of claim 1 wherein, the first dielectric material and the third dielectric layer consist essentially of $Si_3N_4$;

the second dielectric material consists essentially of densified tetraethyl orthosilicate;

the recited electrically conductive material is everywhere conductively doped polysilicon; and further comprising, etching the walls of second dielectric material from the wafer prior to applying the capacitor dielectric layer.

9. The method of forming a capacitor of claim 1 wherein the recited electrically conductive material is everywhere conductively doped polysilicon.

10. The method of forming a capacitor of claim 1 wherein the second and third conductive layers are applied to a thickness ranging from 500 Angstroms to 2000 Angstroms.

11. A method of forming a capacitor on a semiconductor wafer comprising the following steps:

selectively processing the wafer to define upwardly exposed active areas for electrical connection with a lower capacitor plate;

applying a first electrically conductive layer atop the wafer, the first electrically conductive layer covering and engaging the exposed active areas;

applying a first dielectric layer of a first dielectric material atop the wafer over the first conductive layer, the first dielectric material having a first etch rate;

selectively patterning the first dielectric layer and first conductive layer to define an outline for a lower capacitor plate;

applying a second dielectric layer of a second dielectric material atop the wafer over the patterned first dielectric layer, the second dielectric material having a second etch rate which is slower than the first etch rate;

etching the second dielectric layer;

etching the first dielectric layer down to the first conductive layer to produce upwardly projecting walls of second dielectric material surrounding the lower capacitor plate outline;

applying a second electrically conductive layer atop the wafer;

anisotropically etching the second conductive layer to provide a first electrically conductive wall extending upwardly from the first conductive layer;

applying a third dielectric layer atop the wafer, the third dielectric layer comprising a dielectric material having an etch rate which is faster than the second etch rate;

anisotropically etching the third dielectric layer to provide a first dielectric wall extending upwardly from the first conductive layer adjacent the first conductive wall;

applying a third electrically conductive layer atop the wafer over the first conductive and dielectric walls;

anisotropically etching the third conductive layer to provide a second electrically conductive wall extending upwardly from the first conductive layer adjacent the first dielectric wall, the first dielectric wall being sandwiched between the first and second conductive walls;

etching the first dielectric wall from the wafer;

applying a capacitor dielectric layer atop the wafer over the first and second conductive walls and exposed first conductive layer; and applying a fourth electrically conductive layer atop the wafer over the capacitor dielectric layer to form an upper capacitor plate.

12. The method of forming a capacitor of claim 11 further comprising etching the walls of second dielectric material from the wafer prior to applying the capacitor dielectric layer.

13. The method of forming a capacitor of claim 11 wherein the first dielectric material consists essentially of $Si_3N_4$.

14. The method of forming a capacitor of claim 11 wherein the second dielectric material consists essentially of densified tetraethyl orthosilicate.

15. The method of forming a capacitor of claim 11 wherein the third dielectric layer consists essentially of $Si_3N_4$.

16. The method of forming a capacitor of claim 11 wherein the first dielectric material and the third dielectric layer consist essentially of $Si_3N_4$.

17. The method of forming a capacitor of claim 11 wherein the first dielectric material and the third dielectric layer consist essentially of $Si_3N_4$, and the second dielectric material consists essentially of densified tetraethyl orthosilicate.

18. The method of forming a capacitor of claim 11 wherein,
the first dielectric material and the third dielectric layer consist essentially of Si$_3$N$_4$;
the second dielectric material consists essentially of densified tetraethyl orthosilicate;
the recited electrically conductive material is everywhere conductively doped polysilicon, and further comprising,
etching the walls of second dielectric material from the wafer prior to applying the capacitor dielectric layer.

19. The method of forming a capacitor of claim 11 wherein the recited electrically conductive material is everywhere conductively doped polysilicon.

20. The method of forming a capacitor of claim 11 wherein the second and third conductive layers are applied to a thickness ranging from 500 Angstroms to 2000 Angstroms.

21. A method of forming a stacked cell storage capacitor on a semiconductor wafer comprising an array of random access memory cells, the method comprising the following sequential steps:
selectively processing the wafer to form digit lines and word lines and define upwardly exposed active areas for electrical connection with a lower capacitor plate;
applying a first conductively doped polysilicon layer atop the wafer, the first polysilicon layer covering and engaging the exposed active areas;
applying a first dielectric layer of Si$_3$N$_4$ atop the wafer over the first polysilicon layer;
selectively patterning the first dielectric Si$_3$N$_4$ layer and first polysilicon layer to define an outline for a lower capacitor plate;
applying a second dielectric layer of tetraethyl orthosilicate atop the wafer over the patterned first dielectric Si$_3$N$_4$ layer, the layer of tetraethyl orthosilicate having an etch rate which is slower than an etch rate of the Si$_3$N$_4$;
etching the second dielectric layer down to the first dielectric layer;
etching the first dielectric layer down to the first polysilicon layer to produce upwardly projecting walls of tetraethyl orthosilicate surrounding the lower capacitor plate outline;
applying a second conductively doped polysilicon layer atop the wafer over the upwardly projecting walls and first layer of polysilicon to a thickness of from 500 Angstroms to 2000 Angstroms;
anisotropically etching the second polysilicon layer to provide a first polysilicon ring extending upwardly from the first polysilicon layer;
applying a third dielectric layer of Si$_3$N$_4$ atop the wafer;
anisotropically etching the third dielectric layer to provide a ring of Si$_3$N$_4$ extending upwardly from the first polysilicon layer inwardly adjacent the first polysilicon ring;
applying a third conductively doped polysilicon layer atop the wafer over the first polysilicon ring and Si$_3$N$_4$ ring to a thickness of from 500 Angstroms to 2000 Angstroms;
anisotropically etching the third polysilicon layer to provide a second polysilicon ring extending upwardly from the first polysilicon layer inwardly adjacent the Si$_3$N$_4$ ring;
etching the Si$_3$N$_4$ ring from the wafer;
applying a capacitor dielectric Si$_3$N$_4$ layer atop the wafer over the first and second polysilicon rings and exposed first polysilicon layer; and
applying a fourth conductively doped polysilicon layer atop the wafer over the capacitor dielectric Si$_3$N$_4$ layer to form an upper capacitor plate.

22. The method of forming a stacked cell storage capacitor of claim 21 further comprising etching the walls of tetraethyl orthosilicate second dielectric material from the wafer prior to applying the capacitor dielectric Si$_3$N$_4$ layer.

* * * * *